United States Patent [19]

Kay et al.

[11] Patent Number: 4,846,926
[45] Date of Patent: Jul. 11, 1989

[54] HCCDTE EPITAXIALLY GROWN ON CRYSTALLINE SUPPORT

[75] Inventors: Robert E. Kay, Newport Beach; Hakchill Chan, Corona del Mar; Fred Ju, Huntington Beach; Burton A. Bray, Laguna Niguel, all of Calif.

[73] Assignee: Ford Aerospace & Communications Corporation, Newport Beach, Calif.

[21] Appl. No.: 92,858

[22] Filed: Sep. 3, 1987

Related U.S. Application Data

[60] Division of Ser. No. 10,028, Feb. 2, 1987, Pat. No. 4,743,310, which is a continuation-in-part of Ser. No. 880,435, Jun. 30, 1986, abandoned, which is a division of Ser. No. 769,816, Aug. 26, 1985, Pat. No. 4,655,848.

[51] Int. Cl.$^4$ ............................................. C30B 23/02
[52] U.S. Cl. ..................... 156/612; 156/610; 156/DIG. 72; 156/DIG. 82; 437/102; 427/76
[58] Field of Search ....... 156/610, 612, 614, DIG. 72, 156/DIG. 82; 437/3, 102; 148/DIG. 64; 427/76

[56] References Cited

U.S. PATENT DOCUMENTS

| | | | |
|---|---|---|---|
| 3,725,135 | 4/1973 | Hager et al. | 437/3 |
| 4,376,659 | 3/1983 | Castro | 156/DIG. 72 |
| 4,418,096 | 11/1983 | Gauthier et al. | 427/76 |
| 4,447,470 | 5/1984 | Kay | 427/76 |
| 4,487,813 | 12/1984 | Kay | 437/102 |
| 4,566,918 | 1/1986 | Irvine et al. | 437/3 |
| 4,655,848 | 4/1987 | Kay et al. | 437/102 |

OTHER PUBLICATIONS

Tufte et al., "Growth and Properties of $Hg_{1-x}Cd_xTe$ Epitaxial Layers", J. Appl. Phys. vol. 40, No. 11 (1969) pp. 4559–4568.

Cohen-Solal et al., "Epitaxial (CdHg)Te Infrared Photovoltaic Detectors", Appl. Phys. Let., vol. 19, No. 10 (1971), pp. 436–438.

Willardson et al., "Semiconductors and Semimetals", Academic Press, vol. 18 (1981) pp. 92–106.

Piotrowski, T., "Preparation of $Hg_{1-x-y}Cd_xMn_yTe$ Crystals by Isothermal Growth Method", J. Crys. Growth 72 (1985) pp. 117–119.

*Primary Examiner*—Robert L. Stoll
*Assistant Examiner*—R. Bruce Breneman
*Attorney, Agent, or Firm*—Edward J. Radlo; Keith L. Zerschling

[57] ABSTRACT

A layer of HgCdTe (15) epitaxially grown on a crystalline support (10). A single crystal CdTe substrate (5) is first epitaxially grown to a thickness of between 1 micron and 5 microns onto the support (10). Then a HgTe source (3) is spaced from the CdTe substrated (5) a distance of between 0.1 mm and 10 mm. The substrate (5) and source (3) are heated together in a thermally insulating, reusable ampoule (17) within a growth temperature range of between 500° C. and 625° C. for a growth time of between 5 minutes and 13 hours. In a first growth step embodiment, the source (3) and substrate (5) are isothermal. In a second growth step embodiment, the source (3) and substrate (5) are non-isothermal. Then an optional interdiffusion step is performed, in which the source (3) and substrate (5) are cooled within a temperature range of between 400° C. and 500° C. for a time of between 1 hour and 16 hours. Means are disclosed for preventing contamination of the reactants during HgTe (3) synthesis, and for polishing the finished HgCdTe layer (15).

2 Claims, 4 Drawing Sheets

HCCDTE EPITAXIALLY GROWN ON CRYSTALLINE SUPPORT

This is a divisional application of application Ser. No. 010,028, filed Feb. 2, 1987, now U.S. Pat. No. 4,743,310 which is a continuation-in-part application of application Ser. No. 880,435, filed June 30, 1986, now abandoned, which was a divisional application of application Ser. No. 769,816, filed Aug. 26, 1985, which issued as U.S. Pat. No. 4,655,848.

TECHNICAL FIELD

This invention pertains to the field of epitaxially growing HgCdTe (mercury cadmium telluride), useful in infrared detectors and the like, on crystalline supports.

BACKGROUND ART

Figure 2:
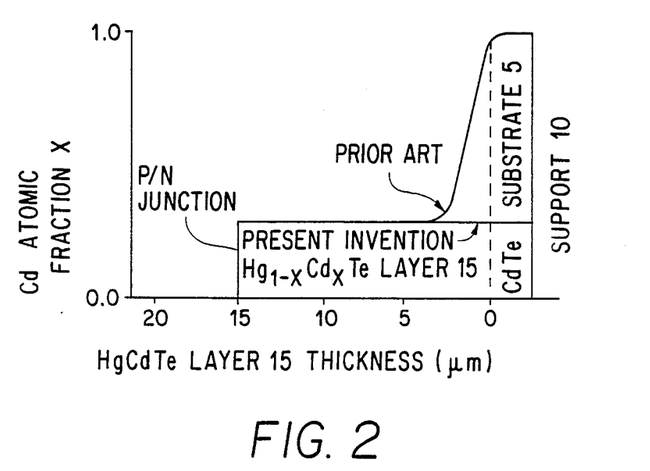
FIG. 2 is a compositional profile of a HgCdTe layer 15 fabricated according to the teachings of the present invention, compared with that for a layer made following the teachings of prior art U.S. Pat. Nos. 4,447,470 and 4,487,813.

U.S. Pat. Nos. 4,447,470 and 4,487,813 disclose methods for epitaxially growing HgCdTe upon CdTe substrates. The present invention differs from the method described in these two patents in that a strong crystalline support is used, the CdTe substrate is beneficially eliminated by the end of the fabrication process, and a cool-down interdiffusion step is optionally present. The compositional profile of the finished HgCdTe is ungraded when the present invention is used, whereas the prior art layers described in these two patents have a graded composition, as graphically indicated in FIG. 2 herein. In the prior art patents, the atomic fraction (x) of cadmium in the epitaxially grown HgCdTe which is a distance of at least 20% of the HgCdTe layer thickness away from the CdTe substrate varies by no more than 10% as a function of said distance, but it does vary. On the other hand, the compositional profile of the present invention is totally sharp, in that the atomic fraction (x) of cadmium in the epitaxially grown HgCdTe 15 does not vary through the entire layer 15. Thus, there is no CdTe 5 left at all. This is highly desirable, because it sharpens the cut-off of the finished HgCdTe infrared detector as a function of wavelength, and increases the RA (resistance times area) product.

The method described in U.S. Pat. Nos. 4,447,470 and 4,487,813 converts CdTe to HgCdTe by interdiffusion, but in that process the HgCdTe is formed on bulk CdTe (1 mm thick), which cannot be completely converted to HgCdTe in a finite period of time. Consequently, there is a Cd concentration gradient in this layer, and thinning by etching will change the x-value of the layer.

U.S. patent application Ser. No. 769,909 filed Aug. 26, 1985, entitled "Non Isothermal Method for Epitaxially Growing HgCdTe" now U.S. Pat. No. 4,648,917 and having the same inventors and assignee as the present application, discloses a non isothermal method for epitaxially gorwing HgCdTe upon CdTe substrates, which method differs from that of the present invention in that: crystalline supports are not always used; there is no cool-down interdiffusion step; there is no restriction on the thickness of the CdTe substrate; and the compositional profile of the finished HgCdTe is graded.

U.S. Pat. No. 4,487,640 discloses a method for epitaxially growing HgCdTe onto CdTe substrates, which method differs from that of the present invention in that: (1) It uses two different sources (16 and 20) maintained at different temperatures, whereas the present invention uses one source. (2) It is not a closely-spaced process, whereas the present invention is. As used herein, "closely-spaced" means the HgTe source and CdTe substrate are spaced apart between 0.1 mm and 10 mm. (3) It uses a carrier gas ($H_2+HX$), whereas the present invention does not. (4) The source zones ($T_2$ and $T_3$) are hotter than the substrate zone ($T_1$). (5) It does not vary the temperatures over the course of the growth phase, whereas the present invention sometimes does.

Tufte et al., "Growth and Properties of $Hg_{1-x}Cd_xTe$ Epitaxial Layers", *J. Applied Phys.*, Vol. 40, No. 11, pp. 4559–4568 (Oct. 1969), describes methods for growing HgCdTe onto CdTe substrates that produce graded compositional profiles, as opposed to the ungraded profiles in the present invention.

U.S. Pat. No. 4,418,096 discloses a method for epitaxially growing HgCdTe onto a CdTe substrate, which method differs from that of the present invention in that: (1) It uses dangerous mercury overpressures of between 4 and 50 atmospheres, col. 2, lines 34–36; the present invention does not use mercury overpressure. (2) The finished layers are at least 158 microns thick, whereas the layers 15 of the present invention are no more than 30 microns thick. (3) The processing time is at least 8 days, whereas that of the present invention is no more than 29 hours. (4) The compositional profile is graded. (5) The source and substrate are always at the same temperature with respect to each other; this is not always true in the present invention.

U.S. Pat. No. 3,622,405 relates to the growth of bulk HgCdTe crystals, not epitaxial layers of same, that are annealed by raising them to temperatures in the vicinity of 755° C.

Vohl et al., *J. Electronic Materials*, Vol. 7, No. 5, pp. 659–678 (1978), discloses a "hot wall" process for making HgCdTe, rather than a closely-spaced process, in which the starting ingredients are elemental Hg, Cd, and Te.

Tennant, W.E., "Recent Developments in HgCdTe Photovoltaic Devices Grown on Alternative Substrates using Heteroepitaxy", *International Electron Devices Meeting, Technical Digest*, Washington, D.C., Dec. 7, 1983, pp. 704–706, uses liquid phase epitaxy to precipitate $Hg_{0.7}Cd_{0.3}Te$ from a tellurium melt onto a CdTe layer grown on sapphire where the CdTe serves as a template for forming the single crystal HgCdTe layer. The present invention completely converts a layer 5 of CdTe grown on a crystalline support 10 to $Hg_{1-x}Cd_xTe$ having an x-value 0.18 to 0.5. The advantages of the crystalline support to Tennant are higher durability, larger size, higher uniformity, and lower cost. The advantage of crystalline support 10 in this invention is to support a very thin layer 5 of CdTe which is completely converted to HgCdTe having an x-value of choice. The resulting thin HgCdTe layer 15 having a thickness appropriate for the fabrication of IR (infrared) devices is, in turn, supported by the crystalline support 10. This makes it possible to handle the very thin, compositionally uniform HgCdTe layer 15 in a fashion commensurate with the fabrication of IR devices.

The method of *Tennant* relies on the precipitation from a Te bath of $Hg_{0.7}Cd_{0.3}Te$ on top of a CdTe/sapphire layer which serves as a template for forming single crystal $Hg_{0.7}Cd_{0.3}Te$. In that method, there is some interdiffusion of the precipitated HgCdTe layer and the CdTe template, so that a Cd concentration gradient exists in the deposited layer; and the product is a double layer of HgCdTe on CdTe. Thus, thinning of the layer by etching results in a different average x-value from the unetched layer. The present method converts by interdiffusion the entire thin film 5 of CdTe to HgCdTe, the x-value of which is controlled. Thus, there is no Cd gradient, and a compositionally uniform layer of HgCdTe on sapphire, GaAs, or other crystalline support 10 results. Thinning this layer by etching does not cause any change in x-value.

U.S. Pat. No. 4,435,224 describes a method for fabricating HgCdTe which relies on phase segregation, not interdiffusion; and, it does not form a single homogeneous HgCdTe layer. It forms a near homogeneous HgCdTe layer of one composition on top of a second HgCdTe layer on top of a CdTe layer. The second HgCdTe layer has a marked compositional gradient (see FIG. 3 of the patent).

DISCLOSURE OF INVENTION

The present invention completely converts a thin substrate (5) of CdTe to a homogeneous layer (15) of $Hg_{1-x}Cd_xTe$ that becomes epitaxially grown onto a crystalline support (10). In the preferred embodiment, the value of x and the thickness of the layer (15) can be uniquely determined by the operator.

A CdTe substrate (5) is first epitaxially grown to a thickness of between 1 micron and 5 microns onto the crystalline support (10). Then a HgTe source (3) is spaced from the CdTe substrate (5) a distance of between 0.1 millimeter and 10 millimeters. Particularly good results have been achieved with 2 mm spacing. The substrate (5) and source (3) are heated within a growth temperature range of between 500° C. and 625° C. for a growth step having a duration of between 5 minutes and 13 hours. The required growth time can be calculated. Optionally, the HgTe (3) and CdTe (5) are then cooled within an interdiffusion temperature range of between 400° C. and 500° C. in an interdiffusion step having a duration of between 1 hour and 16 hours. Preferably, the substrate (5) is at the same constant temperature as the source (3) during the interdiffusion step. The interdiffusion step may be eliminated if the growth period is known to be of adequate length.

The source (3) is $Hg_yTe$ where y is between 0.8 and 1.05, inclusively. The source (3) and substrate (5) are heated together in a thermally insulating reusable ampoule (17). The epitaxially grown $Hg_{1-x}Cd_xTe$ layer (15) has a thickness of between 0.7 microns and 30 microns. It can then be polished, to etch off any unwanted Hg-rich skin on its surface.

During the growth step, changing the crystal plane or the axial orientation of the CdTe substrate (5) does not affect the rate of growth of the HgCdTe layer (15), the single crystal nature of the HgCdTe (15), or its mirror-like finish. All other things being equal, the lower the mole fraction of mercury in the HgTe source (3), the greater the mole fraction of mercury in the grown HgCdTe layer (15), and vice-versa.

In a first embodiment for the growth step, the temperature is substantially constant and substantially the same for both the source (3) and the substrate (5). This embodiment follows many of the teachings of prior art Pat. Nos. 4,447,470 and 4,487,813.

In a second embodiment for the growth step, the substrate (5) is hotter than the source (3) for at least 5 minutes. This embodiment is further discussed in U.S. patent application Ser. No. 769,909 filed Aug. 26, 1985, entitled "Non Isothermal Method for Epitaxially Growing HgCdTe".

BRIEF DESCRIPTION OF THE DRAWINGS

These and other more detailed and specific objects and features of the present invention are more fully disclosed in the following specification, reference being had to the accompanying drawings, in which.

BEST MODE FOR CARRYING OUT THE INVENTION

Perhaps the most troublesome feature of existing VPE (vapor phase epitaxy) methods is the use of quartz tubes, pistons and rings as materials for growth ampoules. New quartz is required for each run because the ampoule is destroyed when it is opened. This increases material and preparation costs, makes conversion to a production method difficult, and, most importantly, compounds the problem of contamination coming from the ampoule. Analyses indicate that impurities in the quartz or from the reagents used to "clean" it are the major sources of impurity dopants found in HgCdTe layers formed by CSVPE (closely spaced vapor phase epitaxy). The sealing process, which consists of fusing the piston to the ampoule by melting it with an $H_2$—$O_2$ flame, may also contribute to this problem, since such high temperatures may release impurities from the quartz which otherwise would remain trapped.

Thus, a reusable ampoule is very desirable, not only because it reduces material costs, but most importantly because with reusable ampoules a large improvement in the consistency of producing device quality HgCdTe 15 is enjoyed. This is so because when containers are repeatedly reused, they undergo self-purification, due primarily to the formation of a pure product coating on their surfaces, and secondarily, to an early leach-out of loosely held contaminants (especially in gas phase reactors).

Figure 1:
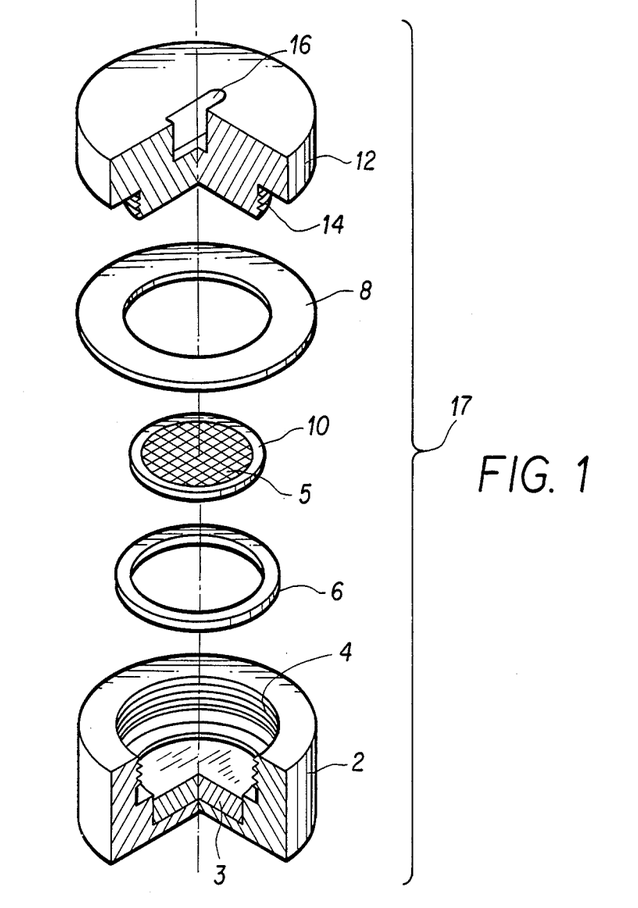
FIG. 1 is an exploded isometric view of a reusable growth ampoule 17 suitable for growing a HgCdTe layer 15 according to the teachings of the present invention.

We have developed a reusable thermally insulating growth fixture 17, as illustrated in FIG. 1. This ampoule can be baked out at 960° C. under $10^{-6}$ torr to free it of surface contaminants. Fixture 17 is made from a thermal insulator, such as machinable polycrystalline $Al_2O_3$ or boron nitrite-silicon nitrite composite, to facilitate the maintenance of source 3 and substrate 5 at different temperatures in those embodiments involving non-isothermal processing, e.g., by separate annular thermocouplers surrounding fixture 17.

Fixture 17 comprises a simple screw-cap lid 12 fitting into a receptacle 2 and sealed by a low-cost gasket 8 made, e.g., of graphoil. Fixture 17 can be used almost indefinitely and need be recharged with a HgTe source 3 only occasionally. Receptacle 2 is fitted with spacers-/adapters 6 whose central openings allow growth on a variety of shapes and sizes of substrates 5. In a fixture 17 that has been built, substrate 5 can be up to two inches in diameter. HgTe source 3, which can be a loose powder, a pressed powder, or a slice from an ingot, can accommodate various sized substrates 5, and is left in receptacle 2 for repeated use.

The growth preparation sequence requires that assembly take place in an inert atmosphere (e.g., argon). To use apparatus 17, the appropriate adapter 6 is placed in receptacle 2, substrate 5 is added, gasket 8 is set in place, and lid 12 is screwed on by means of inserting a screwdriver into slot 16 and twisting. Substrate 5 is grown on the underside of support 10, which is preferably transparent to IR (infrared) energy of at least certain frequencies. Threads 14 of lid 12 engage corresponding threads 4 of receptacle 2. No evacuation of the ampoule 17 is required, since the argon does not adversely affect the growth process. The sealed ampoule 17 is then placed in a furnace for the growth and interdiffusion steps.

The inner volume of growth fixture 17 must be kept relatively small (less than 10 cc for typically-sized layers 15) to maintain the Hg pressure within an effective range. A typical growth apparatus 17 used successfully has a free volume of 2 cm$^3$; consequently, only $8.8 \times 10^{-11}$ moles of CdTe 5 need evaporate into the fixture 17 to saturate the volume at 570° C. This corresponds to an insignificant loss of 5.7 picometers in CdTe 5 thickness.

The HgTe source 3 provides Hg not only by dissociation, but also from interstitial Hg. Since the interstitial Hg concentration is very high, this added Hg pressure is significant and is given by:

$$P_{Hg}(atm) = \tfrac{1}{2}(4vRTK_1/VN_o)^{\tfrac{1}{2}}$$

where
$v$ = volume of HgTe source 3
$V$ = inner volume of growth ampoule 17
$N_o = 6.03 \times 10^{23}$
$K_1 = 2.5 \times 10^{20}$
$T$ = growth temperature(°C.)
$R$ = gas constant The above equation shows that one must control both growth ampoule 17 volume and HgTe 3 volume if reproducible Hg pressures are to be obtained. The volume of the HgTe source 3 is fixed within a narrow range; however, volumes of prior art quartz ampoules can vary significantly, since it is difficult to reproduce the seal and because the dimensions of quartz tubing are subject to considerable variation. On the other hand, with the machined growth fixture 17 shown in FIG. 1, this volume is desirably always the same.

In the present invention, the thin film 5 of CdTe is completely converted to a homogeneous $Hg_{1-x}Cd_xTe$ layer 15, wherein the value of x can be predetermined by the operator over the practical range of 0.5 to 0.18. Crystalline support 10 is any material which allows a thin layer 5 of single crystal CdTe to be grown epitaxially on its surface, and which is stable to temperatures at least as high as those encountered in the layer 15 growth step, i.e., at least 500° C. in any event. Preferably, crystalline support 10 is transparent in some part of the IR spectrum between 1 micron and 25 microns, so that backside illumination of IR devices fabricated on the HgCdTe layer 15 can be used. Crystalline supports 10 which satisfy these three criteria include, for example, synthetic sapphire, GaAs, Si, and InSb. Crystalline support 10 supports the thin precursor CdTe layer 5 and the resulting thin HgCdTe layer 15, making it possible to handle a less than 30 micron thick HgCdTe layer 15 in a fashion commensurate with the fabrication of IR devices.

The CdTe substrate 5 is prepared by epitaxially growing it to a thickness of between 1 micron and 5 microns onto support 10, for example, by an ion-pumped ultrahigh vacuum MBE system having a base pressure of less than $1 \times 10^{-8}$ torr. A single Radak II oven (manufactured by Luxel Corp.) can be used, fitted with a Coors AD998 $Al_2O_3$ crucible, and used as an MBE vapor source. The crucible contains 30 g of CdTe in the form of approximately 1 cc cubes cut from an ultrahigh purity, undoped, high resistivity ($10^8$ ohm-cm) ingot. Sapphire supports 10 are mounted on a Mo heater block and held in place with a Mo mask defining the deposition geometry. Support 10 is preannealed at about 925° C. CdTe films 5 varying in thickness from 1 micron to 5 microns are grown at deposition rates from 1.5 to 7.5 angstroms/sec, and at support 10 temperatures from 260° C. to 350° C.

Alternatively, CdTe films 5 can be deposited in a Perkin-Elmer ULTEK Rapid Cycle Vacuum System utilizing a mechanical blower to reach 100 torr, a dual stage sorption pump to reach $10^{-2}$ torr, and an 8 part differential ion pump to reach the ultimate base pressure in the low $10^{-9}$ torr region. A titanium sublimator and liquid ntirogen jacket are used to increase pumping speed. An 18 inch glass bell jar houses the deposition chamber. Sapphire supports 10 are mounted in a ceramic heater assembly which heats the supports 10 to a conditioning temperature of 725° C. which removes adsorbed water and gases. A Radak II heater with a one inch aperture sublimes the CdTe onto support 10. A UTI mass spectrometer is used to monitor the partial pressures of the residual gases during deposition.

Sapphire epitaxial grade supports 10, supplied by Union Carbide, are prepared for deposition in Class 100 hoods in a Class 1000 clean room. The supports 10 are cleaned by heating at 170° C. for 15 minutes in 1:1 $H_2SO_4$:30% $H_2O_2$ followed by etching away about 4 microns of the surface by heating at 258° C. for 15 minutes in a stirred mixture of 9:1 $H_2SO_4$:$H_3PO_4$ and rinsing in D.I. water. Once chemically cleaned, the supports 10 are mounted in the heater assembly and the chamber is then pumped down to $10^{-8}$ torr. The supports 10 are then subjected to a 725° C. anneal for 10 minutes. Before growth, the CdTe is outgassed at 600° C. for 5 minutes. The CdTe is then allowed to cool to 500° C. while the support 10 is cooled to about 290° C. The shutter in the bell jar is then opened to begin the deposition. Typical growth rates are about 0.4 micron per hour.

The composition of the HgTe source 3 affects the $Hg_{1-x}Cd_xTe$ layer 15 composition in regard to both x-value and impurity content. It is therefore desirable to have a methodology for forming HgTe 3 which produces a consistent wafer composition and minimizes the introduction of contaminants. The usual methodology for compounding HgTe produces ingots which are not uniform in composition and are subject to contamination from impurities leached from their quartz containers at the high reaction temperature (670° C.). In addition, the operation is hazardous because high Hg pressures (often greater than 10 atms) are produced when the reactants are heated. The product often breaks the ampoule when it cools because it sticks to the wall and has a much higher coefficient of thermal expansion than the quartz.

To overcome these problems, a new methodology for compounding $Hg_yTe$ 3 (where y is between 0.8 and 1.05, inclusively) has been developed. In our procedure, all operations are carried out in an atmosphere control station filled with argon having a $H_2O$ and $O_2$ content of less than 10 ppm. To make the $Hg_yTe$, appropriate quantities of Hg and Te are ground together in a diamonite mortar. Since there is no oxygen to form a protective oxide coating on the Te, the Te and Hg react at room temperature during the grinding operation to produce a black powder of $Hg_yTe$. This powder is placed in receptacle 2 of growth apparatus 17, and pressed into a pellet for use as source 3. This procedure eliminates both the hazard associated with compounding HgTe and the contamination due to impurities leaching from hot quartz into source 3.

As an example of the non-isothermal growth step embodiment for epitaxially growing layer 15, a performed procedure for growing 4.5 micron $\lambda_{co}300$ HgCdTe 15 onto a CdTe precursor substrate 5 that has been epitaxially grown onto a sapphire support 10 will now be described. All operations are carried out in an atmosphere control station until after the growth apparatus 17 is sealed.

A one inch diameter CdTe substrate 5 epitaxially grown on a sapphire support 10 is prepared by the procedure described previously, and transferred to the atmosphere control station. A $Hg_{0.9}Te$ source 3 is prepared by grinding together 5.0 g of Te and 7.7 g of Hg. This amalgam is placed in receptacle 2 of reusable growth apparatus 17. The growth apparatus 17 is assembled and sealed by the method described previously, then removed from the atmosphere control station and placed in a microprocessor controlled two-zone furnace.

The growth step has a duration of 110 minutes. Source 3 and substrate 5 start at ambient room temperature. The temperatures of substrate 5 and source 3 are ramped to about 559° C. and 555° C., respectively, over a period of 20 minutes. During the growth step, source 3 temperature never exceeds substrate 5 temperature; this is important, since it prevents spurious droplets of HgTe and/or Te from forming on substrate 5. Layer 15 is allowed to grow for the length of time calculated as herein described at constant substrate 5 and source 3 temperatures.

HgCdTe 15 is grown by converting the entire CdTe layer 5 to HgCdTe 15 of a uniform composition, by interdiffusion of Hg and Cd. This two temperature method independently controls the temperatures of CdTe substrate 5 and $Hg_{0.9}Te$ source 3. $Hg_{1-x}Cd_xTe$ 15 composition is determined by the substrate 5 and source 3 temperatures. Experiments have shown that the x-value of the $Hg_{1-x}Cd_xTe$ 15 increases when substrate 5 temperature increases or source 3 temperature decreases. x-value is primarily controlled by both the HgCdTe 15 and HgTe 3 vapor pressures. These pressures result from the substrate 5 and source 3 temperatures, respectively, and are given as a function of temperature by the following equations:

$$V.P.(HgCdTe) = e^{10.206 - (7149 - (T+273))}$$

$$V.P.(HgTe) = 10^{(3.589 - (1640 - T_3))}$$

where V.P. means vapor pressure; T is substrate 5 temperature in degrees centigrade; and $T_3$ is source 3 temperature in degrees centigrade.

Figure 6:
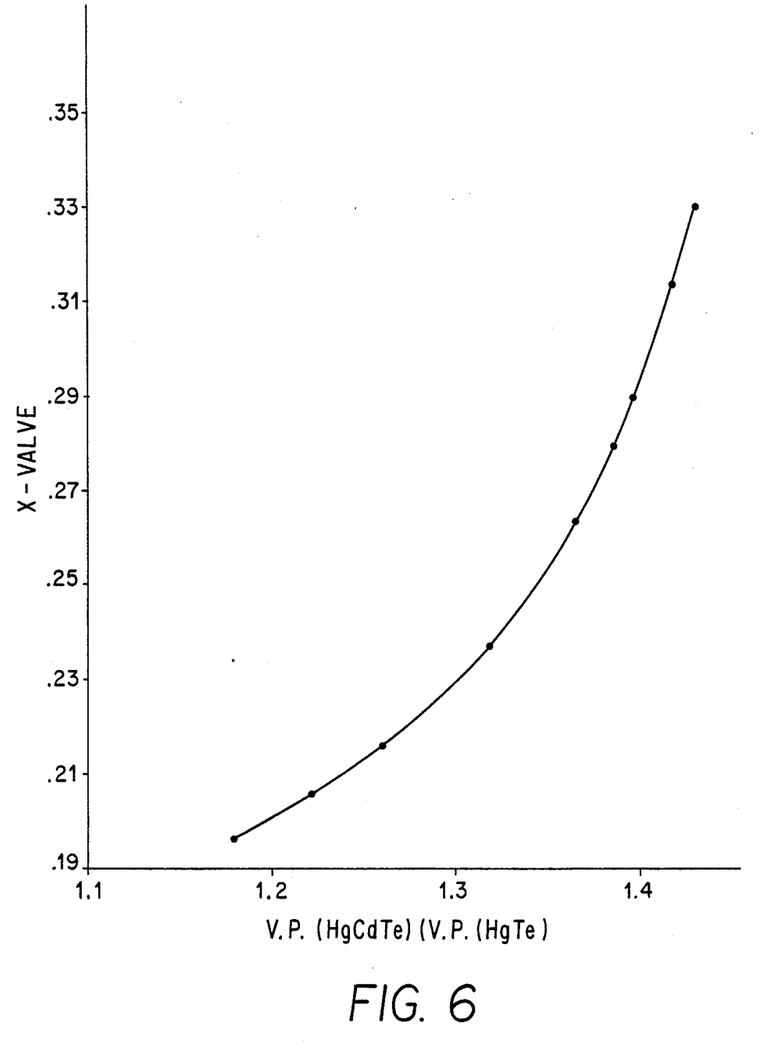
FIG. 6 is a graph of vapor pressure ratios as a function of x for the non-isothermal growth step embodiment.

The relationship of these pressures to the x-value of $Hg_{1-x}Cd_xTe$ 15 grown on sapphire 10 is shown in FIG. 6. The ratio of V.P.(HgCdTe)/V.P.(HgTe) plotted against x-value forms a regular curvilinear trace from which temperature pairs can be selected to grow $Hg_{1-x}Cd_xTe$ 15 of a desired composition. For example, an x-value of 0.3x will result if the V.P.(HgCdTe)/V.P.(HgTe) is 1.405. This ratio can be satisfied by a number of substrate 5/source 3 temperature pairs, including, for example, 600/574, 570/549, 560/541, 550/533, or 500/494. The ability to grow the same HgCdTe 15 composition at a variety of temperature pairs allows the growth rate to be controlled, since growth rate is a function of substrate 5 temperature.

The thickness of the grown HgCdTe layer 15 is related to the growth time by the general equation $d = kt^{\frac{1}{2}}$, where d is the HgCdTe 15 thickness in microns, t is the growth time in minutes, and k is a function of x-value, substrate 5 temperature T, and geometry. k decreases as x increases, and increases as temperature T increases. When the entire CdTe layer 5 is converted to HgCdTe 15, d is determined by the CdTe 5 thickness and desired x value by the equation $d = s/x$, where s is CdTe 5 thickness in microns. Thus, only the value of k as a function of T need be determined to calculate an minimum growth time, t, for complete conversion of CdTe 5 to HgCdTe 15.

Figure 3:
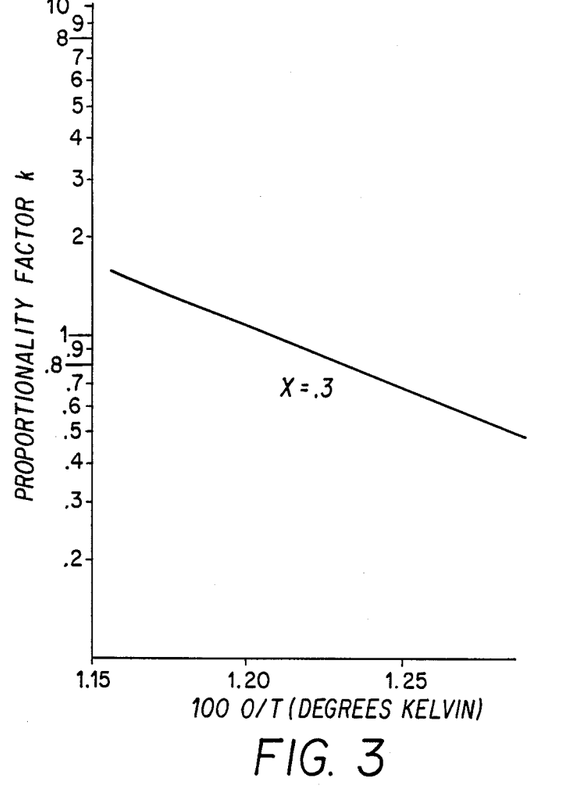
FIG. 3 is a graph of the proportionality factor k as a function of reciprocal substrate 5 temperature for growth of a layer 15 having a composition of $Hg_{0.7}Cd_{0.3}Te$.

As an example, k as a function of 1000/T for the growth of $Hg_{0.7}Cd_{0.3}Te$ on CdTe 5/sapphire 10 is shown in FIG. 3. The required growth time is $t = (d/k)^2$. For a CdTe layer 5 that is three microns thick, $d = 3/(0.3) = 10$ microns. From FIG. 3, k can be found for the desired substrate 5 temperature, and is, for example, 1.2 and 0.92 for 570° C. and 550° C., respectively. (The desired temperature is a function of the desired quality of layer 15; a lower temperature means slower growth, which usually makes for a higher quality crystal. The temperature selected also must be low enough to prevent diffusion of support 10.) The growth time for the complete conversion of a 3 micron thick CdTe layer 5 to a 10 micron thick $Hg_{0.7}Cd_{0.3}Te$ layer 15 is, therefore, 69 minutes at 570° C. and 118 minutes at 550° C..

Thus, by selecting the CdTe 5 thickness, a 10 micron thick layer 15 of $Hg_{1-x}Cd_xTe$ can be grown for any x-value. A 10 micron thick layer 15 is ideal for device fabrication, because it allows complete absorption of the active IR radiation within the charge diffusion path length.

As an alternative to the non-isothermal growth step embodiment described above, substrate 5 and source 3 are heated together at a constant growth temperature. As with the non-isothermal method described above, the growth temperature range in the isothermal method is between 500° C. and 625° C. for a fixed growth time of between 5 minutes and 13 hours. The procedures outlined in U.S. Pat. Nos. 4,447,470 and 4,487,813 are followed, except that the growth temperature can be as low as 500° C., rather than 520° C. the growth time can be as little as 5 minutes rather than 15 minutes; and the growth time can be as long as 13 hours rather than 4 hours.

After the growth step has been performed, whether by the isothermal or non-isothermal method, an optional interdiffusion step is performed. During this step, Hg diffuses from the HgCdTe into the Cd, and Cd diffuses from the CdTe into the HgCdTe. Substrate 5 and source 3 are cooled within an interdiffusion temperature range of between 400° C. and 500° C. for an interdiffusion time of between 1 hour and 16 hours. During the interdiffusion step, substrate 5 and source 3 are typically but not necessarily maintained at the same substantially constant temperature.

Elimination of the interdiffusion step and increasing the growth period during the growth step is the preferred method, since it decreases the overall processing time.

After the growth step and the optional interdiffusion step, no CdTe 5 remains; and for all intents and purposes HgCdTe layer 15 is epitaxially grown onto support 10. This offers the advantages of greater strength than growth on bulk CdTe; the ability to construct larger layers 15; and all the advantages of non-graded compositional profiles, including sharpening the cutoff of the infrared detector as a function of wavelength and increasing the RA product.

After the growth step and optional interdiffusion step, ampoule 17 is removed from the furnace and cooled to room temperature. During this cooling period, HgCdTe 15 continues to grow, invariably Hg-rich and n-type, as contrasted with p-type HgCdTe just below the surface. The thickness of this n-type skin is less than 0.25 micron.

Unless it is desired to use this naturally formed p-n heterojunction, e.g., for fabrication of mesa diodes, the surface is etched to remove the Hg-rich skin. This is done by a new polishing method we have developed, which overcomes the difficulties inherent in the conventional polishing method known as hydroplaning. Our method is extremely simple, and produces surfaces which are nearly equal in smoothness to hydroplaned samples. The methodology requires only a silicone rubber pad, a chemical etchant, and a lucite wafer holder. The support 10 is affixed to the lucite holder with a drop of glycerol, and the HgCdTe layer 15 is polished on the silicone rubber pad, which has been wet with a solution of 0.5% Br in equal parts of methanol and glycerol. Layer 15 is made to move over the rubber pad in a figure eight pattern. The silicone rubber pad removes surface coatings from layer 15, much like a windshield wiper, and allows a steady uniform chemical etch of the surface. Because of its softness, the silicone rubber has no abrasive effect on layer 15. 30 figure eights remove about 0.3 micron of HgCdTe 15. The result is an exceedingly smooth, mirror-like layer 15. We have successfully used this technique for layers 15 having a thickness of about 14 microns and a $\lambda_{co}{}^{300}$ of about 4.5 microns.

Figure 4:
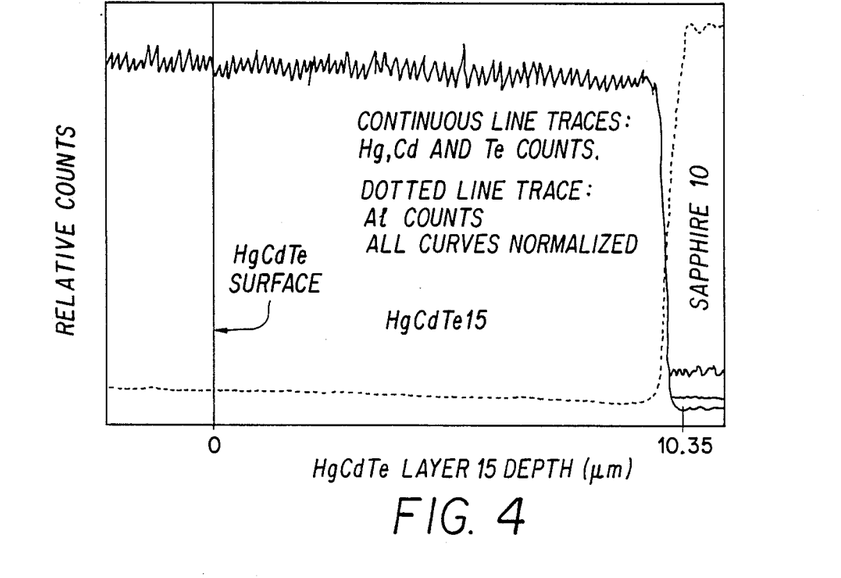
FIG. 4 is a graph of an EDS scan of the 2 degree beveled edge of a wafer comprising a layer 15 of the FIG. 3 variety on a sapphire support 10.

HgCdTe layers 15 grown by the techniques of this invention are of uniform composition with no Cd concentration gradient. This is confirmed by an energy dispersive x-ray spectrometry (EDS) test illustrated in FIG. 4 for a layer 15 having a thickness of 10.35 microns and a $\lambda_{co}{}^{300}$ of 4.5 microns. The curves show signals appearing for Hg, Cd, Te, and Al. The Al is from the sapphire support 10. The curves for all elements have an instrumental drift downward from left to right. With correction for this factor, there is a completely flat compositional profile through the entire layer 15, with an abrupt decrease in the Hg, Cd and Te—and an increase in the Al—signals at the layer 15/sapphire 10 interface. (The curve for Al in the region of layer 15 is simply a baseline, indicating zero Al.) This proves that the whole CdTe layer 5 has been converted to HgCdTe 15 of uniform composition.

Figure 5:
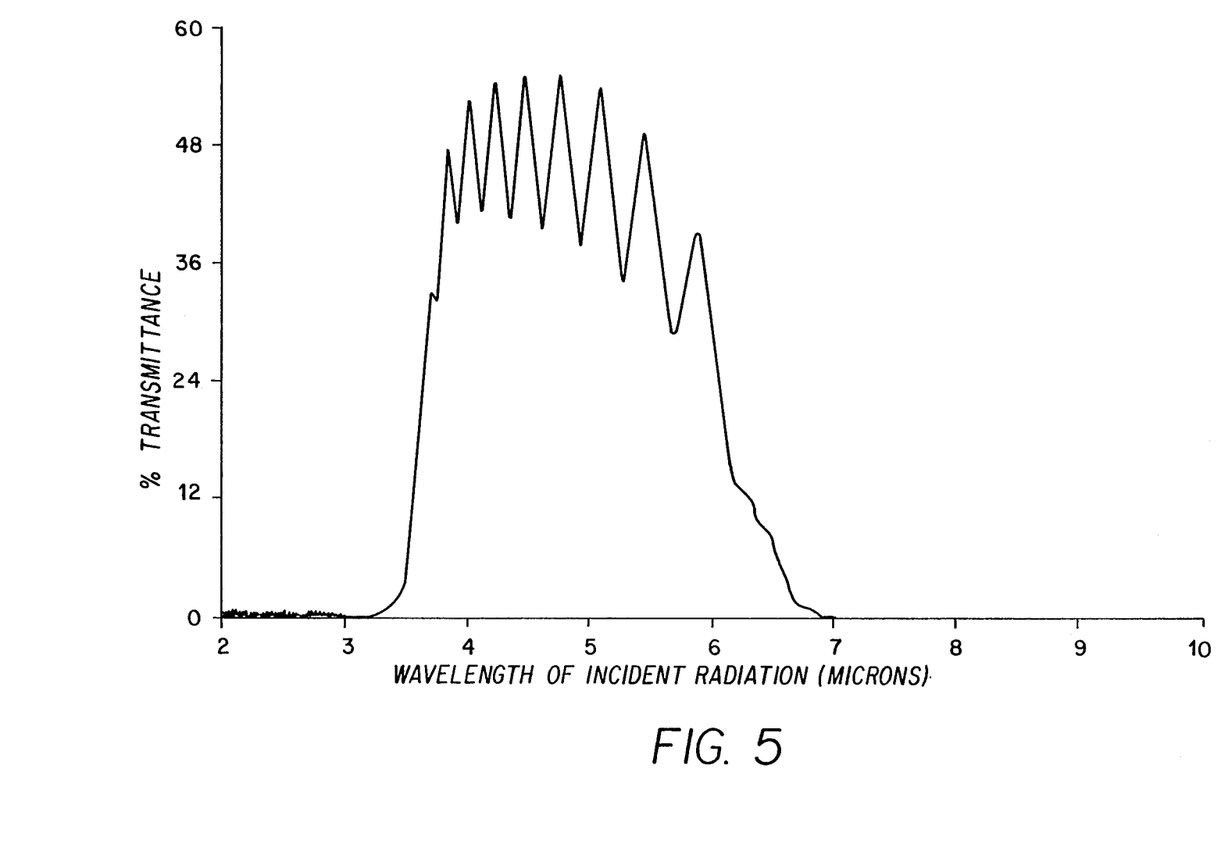
FIG. 5 is a graph of the IR transmittance spectrum of the wafer that is the subject of FIG. 4.

The compositional a uniformity of the HgCdTe layer 15 is also reflected in its IR transmittance spectrum by an extremely abrupt transmission edge, seen in FIG. 5 as the rising edge of the curve just above 3 microns wavelength of incident radiation.

Even HgCdTe layers 15 having perfect cyrstallinity and optical properties are of little use for electro-optic device fabrication if their electrical properties are rendered unfit by contamination with electro-active species. Therefore, contamination control is of great importance in the production of epitaxial HgCdTe layers 15 for electro-optic devices.

Contaminants arise from the following sources: (a) the ambient environment; (b) the reactants HgTe and CdTe; and (c) the growth apparatus.

Contaminants from the ambient environment consist of particulates encountered on work surfaces and in the ambient atmosphere, and gases and vapors (including oxygen and water) present in the atmosphere. To lessen contamination from these sources, all of the apparatus assembly and material preparation should be performed in an atmosphere control station. A typical atmosphere control station contains a high purity argon atmosphere that is continually cycled through a purifier to remove oxygen, water vapor, particulates, and many chemical species. This system provides a work area which has an average oxygen and water content of less than 10 ppm and is essentially particle free.

Contaminants which arise from the HgTe source 3 and the CdTe substrate 5 are due to substances inherent in the materials, or deposited on or in the materials during preparation or synthesis. We purchase six 9's Te and seven 9's Hg packed in argon for the synthesis of the HgTe 3. Consequently, we do not control the contaminants inherent to these materials initially. We have concentrated our efforts on preventing contamination of the reactants during HgTe 3 synthesis. To prevent contamination of HgTe 3 during synthesis, the HgTe 3 is compounded in the atmosphere control station.

The above description is included to illustrate the operation of the preferred embodiments and is not meant to limit the scope of the invention. The scope of the invention is to be limited only by the following claims. From the above discussion, many variations will be apparent to one skilled in the art that would yet be encompassed by the spirit and scope of the invention.

What is claimed is:

1. A method for fabricating a single compositionally homogeneous epitaxial layer of $Hg_{1-x}Cd_xTe$, having a thickness of between 0.7 micron to 30 microns, on a crystalline support, where x is the atomic fraction of cadmium in the layer and is between 0 and 1, said method comprising the steps of:

epitaxially growing a CdTe substrate between 1 micron and 5 microns thick onto the crystalline support;

spacing a HgTe source a distance of between 0.1 mm and 10 mm away from the CdTe substrate; and heating the HgTe and CdTe coated support within a temperature range of between 500° C. and 625° C. for a time of greater than 4 hours and less than 13 hours, so that all of the CdTe is converted to Hg$_{1-x}$Cd$_x$Te having a uniform composition and epitaxially attached to the crystalline support.

2. The method of claim 1 wherein the processing time t of the heating step is calculated from the equation t=(d/k)$^2$ where
   d is the desired thickness of the layer; and
   k is an experimentally determined constant that is proportional to the temperature during the heating step, is inversely proportional to x, and is a function of the geometrical relationship between the HgTe and the CdTe coated support.

* * * * *